United States Patent [19]

Auyang et al.

[11] 3,983,022

[45] Sept. 28, 1976

[54] PROCESS FOR PLANARIZING A SURFACE

[75] Inventors: Raymond P. Auyang, Poughkeepsie, N.Y.; Harold R. Koenig, Derry, N.H.

[73] Assignee: International Business Machines Corporation, Armonk, N.Y.

[22] Filed: Oct. 7, 1974

[21] Appl. No.: 512,781

Related U.S. Application Data

[63] Continuation of Ser. No. 103,250, Dec. 31, 1970, abandoned.

[52] U.S. Cl. .............................................. 204/192
[51] Int. Cl.² ........................................ C23C 15/00
[58] Field of Search .................................. 204/192

[56] References Cited
UNITED STATES PATENTS

| | | | |
|---|---|---|---|
| 2,955,998 | 10/1960 | Berghaus et al. | 204/177 |
| 3,287,612 | 11/1966 | Lepselter | 317/235 |
| 3,479,269 | 11/1969 | Byrnes, Jr. et al. | 204/192 |
| 3,661,747 | 5/1972 | Byrnes, Jr. | 204/192 |
| 3,661,761 | 5/1972 | Koenig | 204/298 |
| 3,676,317 | 7/1972 | Harkins, Jr. | 204/192 |
| 3,684,678 | 8/1972 | Beardmore et al. | 204/192 |

OTHER PUBLICATIONS

Stewart et al., "Microtopography of Surfaces Eroded by Ion Bombardment," J. Mat. Sci. 4, 56 (1969).
Jones et al., "Re-emission Coefficients of Si and $SiO_2$ Films Deposited Through RF and DC Sputtering," J. Appl. Phys., 38 (12), 4656 (1967).
R. M. Valletta, "Control of Edge Profile in Sputter Etching," IBM Tech. Disclosure Bulletin, vol. 10, No. 12, May 1968, p. 1974.
L. I. Maissel et al. "Re-emission of Sputtered $SiO_2$ During Growth and its Relation to Film Quality," IBM J. Res. Dev. 14 (2), 176ff (1970).
J. S. Logan et al., "Metal Edge Coverage and Control of Charge Accumulation in RF Sputtered Insulators," IBM J. Res. Dev., 14 (2) 182ff (1970).

*Primary Examiner*—John H. Mack
*Assistant Examiner*—Aaron Weisstuch
*Attorney, Agent, or Firm*—Isadore Match; Thomas F. Galvin

[57] ABSTRACT

A passivating film, such as silicon dioxide, which has been sputter deposited over a metal stripe in a thin film device is planarized by a resputtering. Since the contour of the sputter-deposited film follows the contour of the metal stripe, the planarization is achieved by adjusting the resputtering to produce a substantially zero deposition rate on the flat surfaces of the film while sputter etching takes place on the slope surfaces of the film. This process is carried on until the surface of the film is planar. In the situation where the metal stripe is relatively wide whereby the sputter planarization of the passivating film would take an undesirably long time, a relatively large portion of the film over the stripe within its perimeter is first chemically etched to a desired depth on the film utilizing a photoresist or other suitable technique and, thereafter, the remaining portions of the film are removed by the sputter etching of their slopes until planarization is achieved.

3 Claims, 7 Drawing Figures

PROCESS FOR PLANARIZING A SURFACE

This is a continuation of application Ser. No. 103,250 filed Dec. 31, 1970, abandoned.

BACKGROUND OF THE INVENTION

This invention relates to sputtering processes. More particularly, it relates to a process for the sputter polishing of thin film devices.

In the construction of thin film devices wherein a passivating and insulating film such as silicon dioxide is sputter-deposited on a patterned metal layer, it has been found that the passivating film tends to follow the contours of the deposited metal pattern. Quite often when it is desired to provide maximum protection for the metal film, a process known as resputtering is resorted to, resputtering being the positive ion bombardment of the passivating film during its deposition. It has been found that such resputtering improves the quality of the sputter-deposited film.

It has also been found, however, that an excessive amount of resputtering in the sputter deposition of a silicon dioxide passivating film may sputter etch the edge of a metal stripe prior to the stripe's being covered with the film. In the resputtering process, there may also occur the sputter-etching of slope surfaces of the silicon dioxide film, the slope surfaces being those which follow the contours of the underlying metal. In addition, there may be deposition on the flat surfaces of the film.

In the production of thin film multilevel devices, it is highly desirable to produce planar or as near planar surfaces as is possible of each passivating film layer as successive levels are added to the device.

Accordingly, it is an important object of this invention to provide a method for sputter polishing passivating and insulating films in thin film devices to produce a relatively planar surface on the passivating film.

It is another object to provide a process in accordance with the preceding object wherein there is prevented the sputter-etching of the edges of the metal stripes on which the film is being deposited during the film's deposition.

SUMMARY OF THE INVENTION

Generally speaking, and in accordance with the invention, there is provided a method for producing a planar surface on a passivating or insulating film of a thin film device wherein the insulating film overlies a metal stripe which is on a substrate, the portion of the film over the stripe forming a substantially first flat surface in a first plane, the portion of the film on the substrate forming substantially second flat surfaces in a second plane, the portions of the surface of the insulating film between the first and second surfaces being sloped. The method comprises the sputter etching of the sloped portions until the total surface of the insulating film lies in the second plane. In the situation where it is desired to save time, a part of the portion of the film overlying the stripe and which is within the sloped portions is chemically etched to the depth of the second plane and then the sloped portions are sputter etched until the total surface of the insulating film lies in the second plane.

The foregoing and other objects, features and advantages of the invention will be apparent from the more particular description of preferred embodiments of the invention, as illustrated in the accompanying drawings.

DESCRIPTION OF PREFERRED EMBODIMENTS

Figure 1:
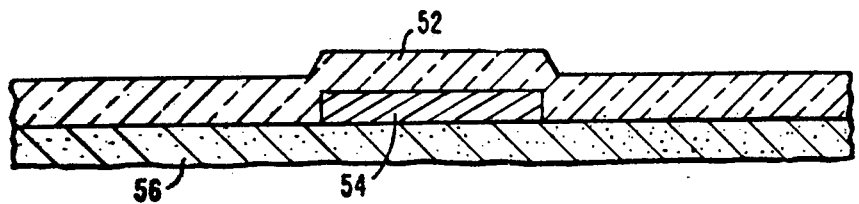
FIG. 1 is a cross section of a thin film device which illustrates the contour of a sputter-deposited passivating insulating film overlying a metal stripe and the substrate on which the stripe rests.

In FIG. 1, there is depicted the contour of a sputtered silicon dioxide film 52 on a metal stripe 54, the stripe resting on the substrate 56. It is seen therein that the contour of silicon dioxide film 52 essentially follows the contour of metal stripe 54. This type of contour results when an amount of resputtering is undergone which is such as to give substantially maximum protection to the metal stripe by the silicon dioxide film. It is recalled that resputtering is the positive ion bombardment of the silicon dioxide film during deposition, such resputtering being discussed in the publication by L. I. Maissel and and P. M. Schaible, J. App. Phys. 36, 237 (1965) and in the publication by R. E. Jones, C. L. Standley, and L. I. Maissel, J. App. Phys., 38, 4656 (1967).

Figure 2:
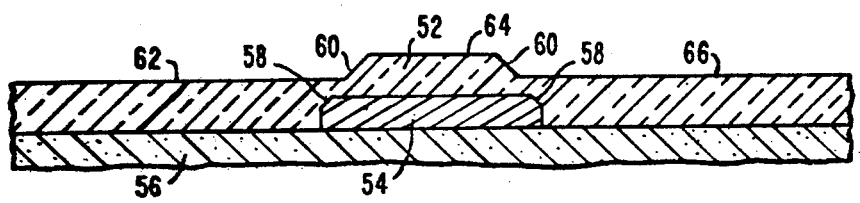
FIG. 2 is a view similar to FIG. 1 and illustrates the effect of excessive resputtering on the edges of the metal stripe during the growth of the insulating film.

In FIG. 2, there is shown the results which ensue when a relatively great amount of resputtering is resorted to in the growth of film 52. The amount of resputtering is such that the edges of metal stripe 54 are etched before they are covered with the silicon dioxide film as shown at region 58. There also occurs, when resputtering is of a large amount, etching on the slopes 60 of the silicon dioxide film and deposition on the flat surfaces 62, 64 and 66 of the film.

Figure 3:
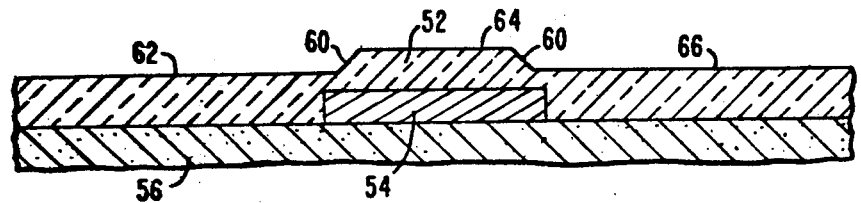
FIG. 3 is a view similar to that of FIGS. 1 and 2 showing a sputter-deposited insulating film in a particular contour on a metal stripe on a substrate.
Figure 4:
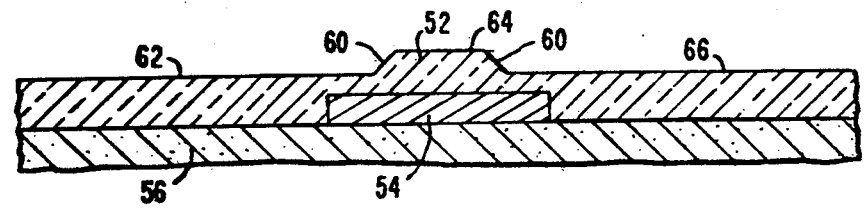
FIG. 4 is a view similar to that of FIG. 3 and shows the contour of the insulating film of FIG. 3 after it has been partially sputter-etched according to the invention.
Figure 5:
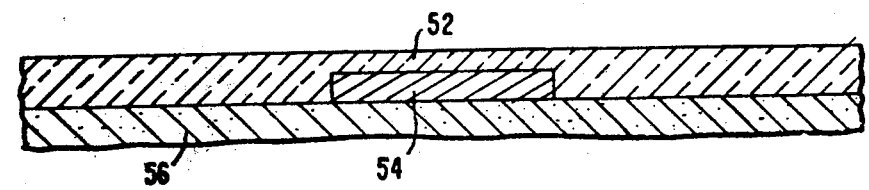
FIG. 5 is a view similar to that of FIGS. 3 and 4 and illustrates the planar surface of the insulating film after sputter etching, according to the invention, has been completed.

In FIG. 3, there is depicted a structure wherein the silicon dioxide film 52 has been deposited with the contour as shown. Let it be assumed, that the structure shown in FIG. 3 is then placed in a known sputtering system, such as of the RF type, for which resputtering has been adjusted to produce essentially a zero deposition rate on the flat surfaces 62, 64 and 66. There then occurs a rapid sputter etching on the slope surfaces 60 of the silicon dioxide film 52. After some period of sputter etching on the slope surfaces, the contour of the silicon dioxide film appears as shown in FIG. 4. Such sputter etching thereafter is continued until the surface of silicon dioxide film 52 is planar as shown in FIG. 5. Thereby, the sputter polishing of the silicon dioxide film is achieved in accordance with the invention.

The sputter polishing of the silicon dioxide film as described hereinabove can be accomplished in conventional sputtering systems. For example, it can be achieved in a three-electrode system using two RF driven electrodes in the normal target and holder electrode positions. Alternatively, it can be accomplished in a controlled area ratio of electrodes sputtering system.

In carrying out the process, the silicon dioxide film can first be sputter deposited followed by a sputter polishing operation. Alternatively, these two operations can be combined. In the event that they were to be combined, the resputtering, i.e., the sputter polishing operation would at the outset employ a relatively low amount of resputtering to avoid sputter etching of the edges of the metal stripes. After the deposited silicon dioxide film had attained a thickness approximately equal to that of the metal stripe, the resputtering could be substantially increased so that the deposition rate on the flat surfaces of the silicon dioxide would be zero to minimal and the sputter etching on the slopes was quite great. By an appropriate choice of resputtering rates, the surface of the silicon dioxide film can be made planar by the time the film has attained a requisite thickness.

In carrying out the above-described process, i.e., the planarization of the silicon dioxide film by adjusting the resputtering in the sputtering system for substantially zero deposition rate on the flat surfaces whereby the slope surfaces then sputter etch at a relatively high rate, with wafers thermally floating on the substrate holder, the slope surfaces of a silicon dioxide film, initially over the edges of metal stripes, can be etched at a rate of approximately 1.3 microns per hour along flat surfaces. With such etch rate, the planarization of a silicon dioxide film over a 10 micron wide strip can be achieved in about 4 hours.

There may occur situations where the metal stripes are quite wide and wherein the thin film devices are of relatively large dimensions. With such devices, the time period for complete planarization of the silicon dioxide film surface, according to the invention, may be undesirably long. In such a situation, there can first be resorted to, a chemical etching of the silicon dioxide film followed by the resputtering planarization.

Figure 6:
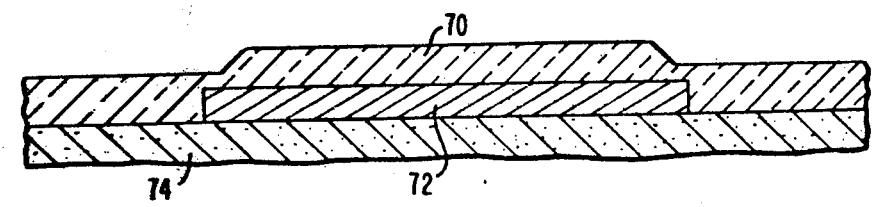
FIG. 6 is a view similar to that of FIG. 3 but illustrating an insulating film overlying a relatively wide metal stripe.
Figure 7:
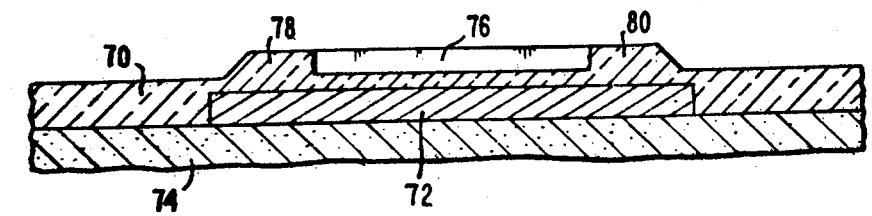
FIG. 7 shows the structure of FIG. 6 after it has been subjected to a chemical etching, according to the invention.

In this connection, FIG. 6 illustrates the contour of a silicon dioxide film 70 over a relatively wide metal stripe 72 which in turn rests on a suitable substrate 74 such as a semiconductor, silicon, for example. To achieve a time saving in the planarization of film 72, a conventional chemical etching can be first carried out on the silicon dioxide film to a depth equal to the desired device thickness as shown in region 76. A suitable etchant to be used in this etching is one comprising seven parts by volume of a 40% aqueous ammonium chloride solution to one part of concentrated hydrofluoric acid. A typical etch rate is about 1000A per minute. The chemical etching process is one well known to those skilled in the art and no further description thereof is deemed necessary. The desired etching pattern is provided by a known photoresist chemical etching process which is also well known. Since the photoresist pattern cannot be sufficiently precisely matched to the stripes and the devices to produce a planarized surface from chemical etching above, a pattern is made for chemically etching a large portion of the area of the silicon dioxide film.

After the chemical etching, the remaining portions 78 and 80 of the silicon dioxide film projecting above the desired surface level of the film can be removed by polishing in accordance with the sputtering process described hereinabove to thereby complete the planarization.

While the invention has been particularly shown and described with reference to preferred embodiments thereof, it will be understood by those skilled in the art that the foregoing and other changes in form and details may be made therein without departing from the spirit and scope of the invention.

We claim:

1. A method of providing a planar surface on an insulating film of a thin film device, wherein said insulating film overlies a metal stripe which is on a substrate, the portion of said film over said stripe forming an upper first substantially flat surface in a first plane, the portion of said film on said substrate forming lower second substantially flat surfaces in a second plane, the portions of said insulating film between said first and second surfaces being sloped, comprising:
   sputter etching said sloped portions while not affecting said metal stripe until the total surface of said insulating film substantially lies in said second plane.

2. A method of providing a planar surface on an insulating film of a thin film device, wherein said insulating film is being sputter deposited on a metal stripe lying on a substrate, the portion of said film over said stripe forming an upper first substantially flat surface in a first plane, the portion of said film on said substrate forming lower second substantially flat surfaces in a second plane, the portions of said film between said first and said second surfaces being sloped, comprising:
   resputtering said insulating film while not affecting said metal stripe, said resputtering being adjusted to produce substantially zero deposition on said flat surfaces whereby said sloped surfaces are sputter etched, said resputtering being carried on until the surface of said insulating film lies in said second plane.

3. A method of providing a planar surface on the insulating film of a thin film device, wherein said insulating film has been sputter deposited on a metal stripe lying on a substrate, the portion of said film over said stripe forming an upper first substantially flat surface in a first plane, the portion of said film on said substrate forming lower second substantially flat surfaces in a second plane, the portions of said film between said first and said second surfaces being sloped, comprising:
   chemically etching a part of said portion of said film over said stripe and within said sloped surfaces to a depth substantially co-planar with said second plane while not affecting said metal stripe; and
   sputter etching said sloped surfaces until the total surface of said insulating film substantially lies in said second plane while not affecting said metal stripe.

* * * * *